United States Patent
Gill et al.

(10) Patent No.: US 7,423,850 B2
(45) Date of Patent: Sep. 9, 2008

(54) CPP-GMR READ HEAD SENSOR WITH SYNTHETIC FREE LAYER PROVIDING SUPPRESSION OF SPIN TORQUE NOISE

(75) Inventors: Hardayal Singh Gill, Palo Alto, CA (US); Neil Smith, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 523 days.

(21) Appl. No.: 11/095,803

(22) Filed: Mar. 31, 2005

(65) Prior Publication Data
US 2006/0221512 A1    Oct. 5, 2006

(51) Int. Cl.
*G11B 5/39* (2006.01)
(52) U.S. Cl. .................................. 360/324.12
(58) Field of Classification Search ............. 360/324.12
See application file for complete search history.

(56) References Cited

U.S. PATENT DOCUMENTS

| | | | |
|---|---|---|---|
| 5,695,864 A | 12/1997 | Slonczewski | |
| 5,780,176 A | 7/1998 | Iwasaki et al. | |
| 5,919,580 A | 7/1999 | Barnard et al. | |
| 6,105,237 A | 8/2000 | Gill | |
| 6,295,175 B1 | 9/2001 | Tomita et al. | |
| 7,242,045 B2 * | 7/2007 | Nguyen et al. | 257/295 |
| 2003/0151407 A1 | 8/2003 | Black et al. | |
| 2004/0161636 A1 | 8/2004 | Hujanen et al. | |

FOREIGN PATENT DOCUMENTS

JP    2003110167 A  *  4/2003

OTHER PUBLICATIONS

Bailey et al., "Control of Magnetization Dynamics in Ni81Fe19 Thin Films Through the Use of Rare Earth Dopants", IEEE Trans on Magnetics, vol. 37, No. 4, Jul. 2001, p. 1749-1754.
Zhu et al., "Spin Transfer Induced Noise in CPP Read Heads", IEEE Trans on Magnetics, vol. 40, No. 1, Jan. 2004, p. 182-188.

* cited by examiner

*Primary Examiner*—Craig A Renner
(74) *Attorney, Agent, or Firm*—D'Arcy H. Lorimer; Lorimer Labs

(57) ABSTRACT

Improved sensitivity GMR sensors useful for thin film magnetic read heads are disclosed. Spin transfer induced destabilization of the magnetic free layer is suppressed through the application of Tb containing alloys in the free layer. Sense currents can be increased by a factor of five in comparison to prior art designs without an increase in spin transfer induced noise.

9 Claims, 5 Drawing Sheets

CPP-GMR READ HEAD SENSOR WITH SYNTHETIC FREE LAYER PROVIDING SUPPRESSION OF SPIN TORQUE NOISE

BACKGROUND OF THE INVENTION

1. Field of the Invention

This invention relates to the structure of thin film magnetic read heads. More specifically, the invention relates to the improvement of sensitivity in giant magnetoresistive sensors.

2. Description of the Related Art

FIG. 1 (Prior Art) is a partial cross sectional view of a thin film read/write head combination. A read head 104 employing a giant magnetoresistive sensors 106 (hereinafter referred to as a "GMR sensors") is combined with an inductive write head 102 to form a combined magnetic head 100. In a magnetic disk or tape drive an air bearing surface (ABS) of the combined magnetic head is supported adjacent to the moving magnetic media to write information on or read information from a surface of the media. In a write mode, information is written to the surface by magnetic fields that fringe across gap 114 between first 112 and second 116 pole pieces of the write head 102. Write head 102 also comprises yoke 120, coil 118, and backgap 122. In a read mode, the resistance of the GMR sensor 106 changes proportionally to the magnitudes of the magnetic fields from the moving magnetic media. When a sense current is conducted through the GMR sensor 106, resistance changes cause potential changes that are detected and processed as playback signals.

FIG. 2 (Prior Art) is an air bearing surface view 200 of read head 104 of FIG. 1. GMR sensor 106 includes a nonmagnetic conductive layer 206, also called a spacer layer, sandwiched between first and second ferromagnetic layers, referred to as a pinned reference layer 208, and a free layer 204. The magnetization of the pinned reference layer 208 is maintained ("pinned") at 90 degrees to the magnetization of the free layer 204 by exchange coupling with pinned layer 212 and anti-ferromagnetic layer 214. The magnetization of the free layer 204 changes freely in response to magnetic fields from the moving magnetic media at the air bearing surface. When the directions of magnetization of the pinned and free layers are parallel, scattering of conduction electrons passing through the layers is minimal, and when the directions are antiparallel, scattering is maximized. Changes in the scattering of the conduction electrons change the resistance of the GMR sensor in proportion to $\sin\theta$, where $\theta$ is the angle between the magnetizations of the pinned and free layers. Sense DC current $I_{DC}$ 150 is conducted through the GMR sensor for detecting a change in resistance of the layer structure. This configuration of GMR sensor is typically known as a CPP-GMR sensor, which employ a sense current perpendicular to the plane of film layers. The change of resistance of the layer structure produces a voltage $V_{sense}$ 152 which is directed to the monitoring electronics.

The anti-ferromagnetic layer 214 interfacially engages the pinned layers 212 and 208 in order to pin the magnetization of the pinned layers in a predetermined direction by magnetic exchange coupling. Since the anti-ferromagnetic pinning layer is not magnetized, it exerts no magnetic influence on the free layer 204. This is advantageous since the magnetization of the free layer should be free to rotate about a bias point in response to magnetic fields from the moving magnetic media. Advantageously, the magnetization of the pinned layers 212 and 208 can be strongly pinned by the anti-ferromagnetic pinning layer 214 so that their orientation cannot be easily changed by stray magnetic fields.

Structurally, the read head 104 includes a GMR sensor 106 sandwiched between shield layers 108 and 110. GMR sensor 106 typically comprises a 30 angstrom NiFeCr seed layer 216; a 150 angstrom PtMn anti-ferromagnetic pinning layer 214 grown on the seed layer 216; a CoFe pinned layer 212 grown on layer 214; a 4-8 angstrom Ru layer 210; a second CoFe pinned reference layer 208 grown on layer 210; a Cu 20-40 angstrom spacer layer 206 grown on pinned layer 208; a CoFe/NiFe 30 angstrom free layer placed on spacer layer 206; and, a Ta interface layer 202 grown between the free layer 204 and Shield 2 ref 110.

U.S. Pat. No. 5,695,864 discloses a device in which electrons flow through a free or excitable magnet, or reflect from it, to make its magnetization respond. To accomplish this, the spin vectors of the flowing electrons are preferentially polarized by an auxiliary ferromagnet, whose moment orientation is fixed. The electrons flow between the fixed and free ferromagnets through a non-magnetic metallic spacer which is thick enough to make the static inter-magnetic exchange coupling negligible. While transmitting through or reflecting from the free ferromagnet, the spins of the moving electrons interact by quantum-mechanical exchange with the local, permanently present, spontaneously-polarized electron spins of the free magnet. This interaction causes a transfer of vectorial angular momentum between the several metallic layers in the device which causes the magnetization vector of the free magnet to change its direction continually with time. Thus excited, the magnetization vector will precess about its original axis. The precession cone angle will either attain a new equilibrium value which will be sustained by the current or will increase beyond 90 degrees and precess with decreasing amplitude until the magnetization vector has reversed by 180 degrees from its initial direction.

U.S. Pat. No. 5,780,176 discloses an exchange coupling film having a stacked-film-structure consisting of a ferromagnetic film made of at least one material of Fe, Co and Ni, and an anti-ferromagnetic film. The exchange coupling film is made of a ferromagnetic material to which an element is added, provided at the interface between the ferromagnetic film and the anti-ferromagnetic film so as to improve the lattice matching. This results in the enhancement of the exchange coupling force. A magnetoresistance effect element including an exchange coupling film described above, and an electrode for supplying a current to the ferromagnetic film constitutes the exchange coupling film.

U.S. Pat. No. 5,919,580 discloses a spin valve device containing a chromium or chromium and aluminum anti-ferromagnetic layer, which acts as a pinning layer for a magnetoresistive ferromagnetic layer, by exchange coupling. The anti-ferromagnetic layer has a tunable Neel temperature and anisotropy constant, and is corrosion resistant.

U.S. Pat. No. 6,105,237 discloses a spin valve sensor provided with a spacer layer sandwiched between a free layer and a pinned layer. The pinned layer is pinned by a pinning layer constructed of a material having a high coercivity, and a low magnetic moment. The high coercivity is employed for pinning the pinned layer, and the low moment assures that stray fields from the pinning layer do not affect the coercivity of the free layer. The magnetic moment is preferably less than 300 emu/cc and the coercivity is preferably greater than 500 Oe. The magnetic orientation of the pinning layer is set by a magnetic field at room temperature that may be applied at the suspension level. The materials with which the pinning layer may be formed are amorphous materials TbFeCo and CoSm, and a non-amorphous material CoPtCr, provided the Cr is of sufficient proportion to minimize the moment of the CoPtCr material.

US Patent Application Publication US 2003/0151407 discloses a structure and method for forming a magnetic-field sensor device comprising depositing a first electrode onto a substrate. Then, an electrically insulating layer is deposited on the first electrode. Next, a portion of the insulating layer is removed to expose a region of the first electrode, thereby creating an empty space. After this, at least one layer of chemically-synthesized nanoparticles is deposited on the insulating layer and within the empty space. Next, a second electrode is deposited on both the layer of nanoparticles and the insulating layer. Alternatively, multiple layers of nanoparticles may be deposited, or only a single nanoparticle may be deposited. The substrate is either conducting or non-conducting, and the first and second electrodes are electrically conducting and may be magnetic or non-magnetic. Additionally, a metallic layer of magnetic material may be first deposited on the substrate.

US Patent Application Publication US 2004/0161636 discloses a structure and method of fabricating a magnetic read head, comprising forming a fill layer for a magnetic read head gap using atomic layer deposition (ALD). The fill layer comprises an insulator, preferably aluminum oxide, aluminum nitride, mixtures thereof and layered structures thereof. Materials having higher thermal conductivity than aluminum oxide, such as berylium oxide and boron nitride, can also be employed in layers within an aluminum oxide structure. The thickness of the ALD-formed head gap fill layer is between approximately 5 nm and 100 nm, preferably between approximately 10 nm and 40 nm.

In an article entitled "Control of Magnetization Dynamics in $Ni_{81}Fe_{19}$ Thin Films Through the Use of Rare Earth Dopants", by Bailey et al., (IEEE Transactions on Magnetics, Vol. 37, No. 4, July 2001, pg 1749), the magnetization dynamics of soft ferromagnetic thin films tuned with rare earth dopants is disclosed. Low concentrations (2 to 10%) of Tb in 50 nm $Ni_{81}Fe_{19}$ films are found to increase the Gilbert magnetic damping parameter alpha over two orders of magnitude without great effect on easy axis coercivity or saturation magnetization.

One way to increase the sensitivity of the GMR sensors described above is to increase $I_{DC}$, which increases $V_{sense}$ for a given magnetic signal amplitude. However, increasing $I_{DC}$ beyond a certain point creates spin transfer torques which produce gross instability in the magnetization of the free layer. This instability is manifest as oscillations in the magnetization of the free layer, which are large enough in amplitude to obscure the magnetization changes induced by the moving media. The instability of the free layer induced by the spin transfer torques of the sense current, produces a type of noise which can be called spin transfer induced noise. It is noise because it produces a signal containing random fluctuations that can obscure the measurement signal of interest. It is to be distinguished from other types of noise such as thermal noise. The spin transfer induced noise significantly limits the sensitivity of prior art CPP-GMR sensors. What is needed is an improved GMR sensor having improved sensitivity and stability.

SUMMARY OF THE INVENTION

It is an object of the present invention to provide a GMR sensor comprising an anti-ferromagnetic layer, a first pinned layer coupled to the anti-ferromagnetic layer, an interface layer formed over the first pinned layer, a second pinned layer formed over the interface layer, a spacer layer formed over the second pinned layer, and a free layer comprising a NiFeTb alloy formed over the spacer layer.

It is another object of the present invention to provide a dual GMR sensor comprising a first anti-ferromagnetic layer, a first pinned layer formed over the first anti-ferromagnetic layer, a first spacer layer formed over the first pinned layer, a second anti-ferromagnetic layer, a second pinned layer formed over the second anti-ferromagnetic layer, a second spacer layer formed over the second pinned layer, and a free layer interposed between the first and second spacer layers, said free layer comprising a NiFeTb alloy.

It is yet another object of the present invention to provide a dual GMR sensor comprising a first anti-ferromagnetic layer, a first pinned layer formed over the first anti-ferromagnetic layer, a second anti-ferromagnetic layer, a second pinned layer formed over the second anti-ferromagnetic layer, and a free layer interposed between the first and second pinned layers, said free layer comprising a NiFeTb alloy.

BRIEF DESCRIPTION OF THE DRAWINGS

The present invention will be better understood when consideration is given to the following detailed description thereof. Such description makes reference to the annexed drawings, wherein.

DETAILED DESCRIPTION OF THE PREFERRED EMBODIMENTS

Spin transfer induced instability of the free layer magnetization is one major limiting factor for increasing the sensitivity of GMR sensors. As the DC current $I_{DC}$ is increased, the moving electrons spin gets polarized, which can destabilize the free layer via a spin induced torque effect. The origin of this phenomenon is the systematic absorption of energy from the spin-polarized conduction electron current into the spin-system which comprises what is typically referred to as the magnetization. If the rate at which the energy is absorbed (or pumped into) the spin/magnetization system is greater than that by which the magnetization can loose energy to the mechanical motion of the lattice (of constituent atoms), then the magnetization can start to gyrate. The gyrations are symptomatic of a destabilization of the free layer magnetization. This destabilization manifests itself as a type of noise voltage that is added to the signal voltage. It can be described as noise because it produces a signal containing random fluctuations that obscures the measurement signal of interest. It should not be confused with other types of noise such as thermal noise, which may also be present. Suppression of this spin transfer induced noise voltage, that occurs as a result of the destabilization of the free layer magnetization, is required to improve the magnetic sensitivity of the GMR sensor. It is an object of the present invention to provide a free layer structure that enhances the stability of the free layer magnetization at higher $I_{DC}$ current levels and reduces spin transfer induced noise. The enhanced stability allows higher $I_{DC}$ current levels and subsequently improved sensor sensitivity.

Figure 1:
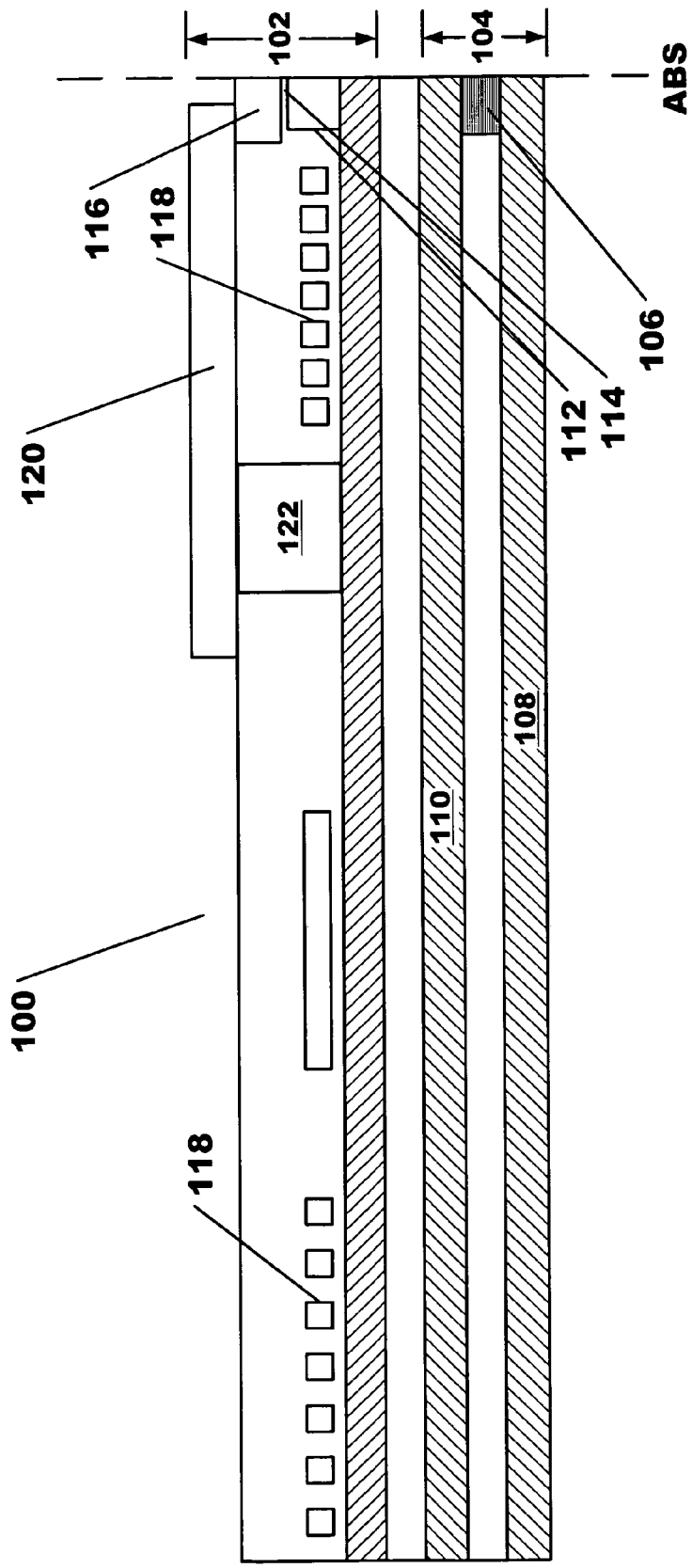
FIG. 1 (Prior Art) is a partial cross sectional view of a thin film read/write head combination.
Figure 2:
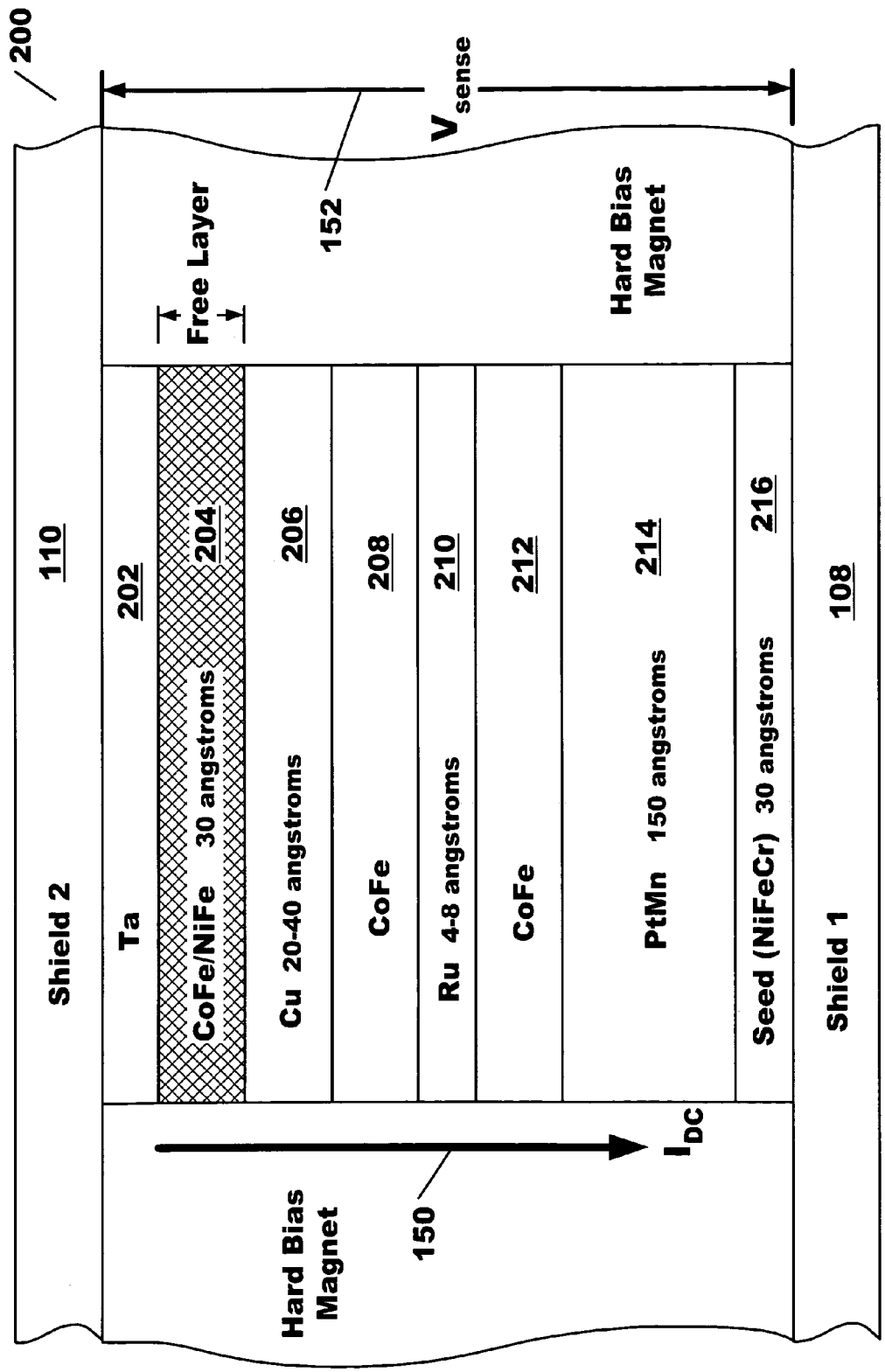
FIG. 2 (Prior Art) is an air bearing surface view of read head 104 of FIG. 1.
Figure 3:
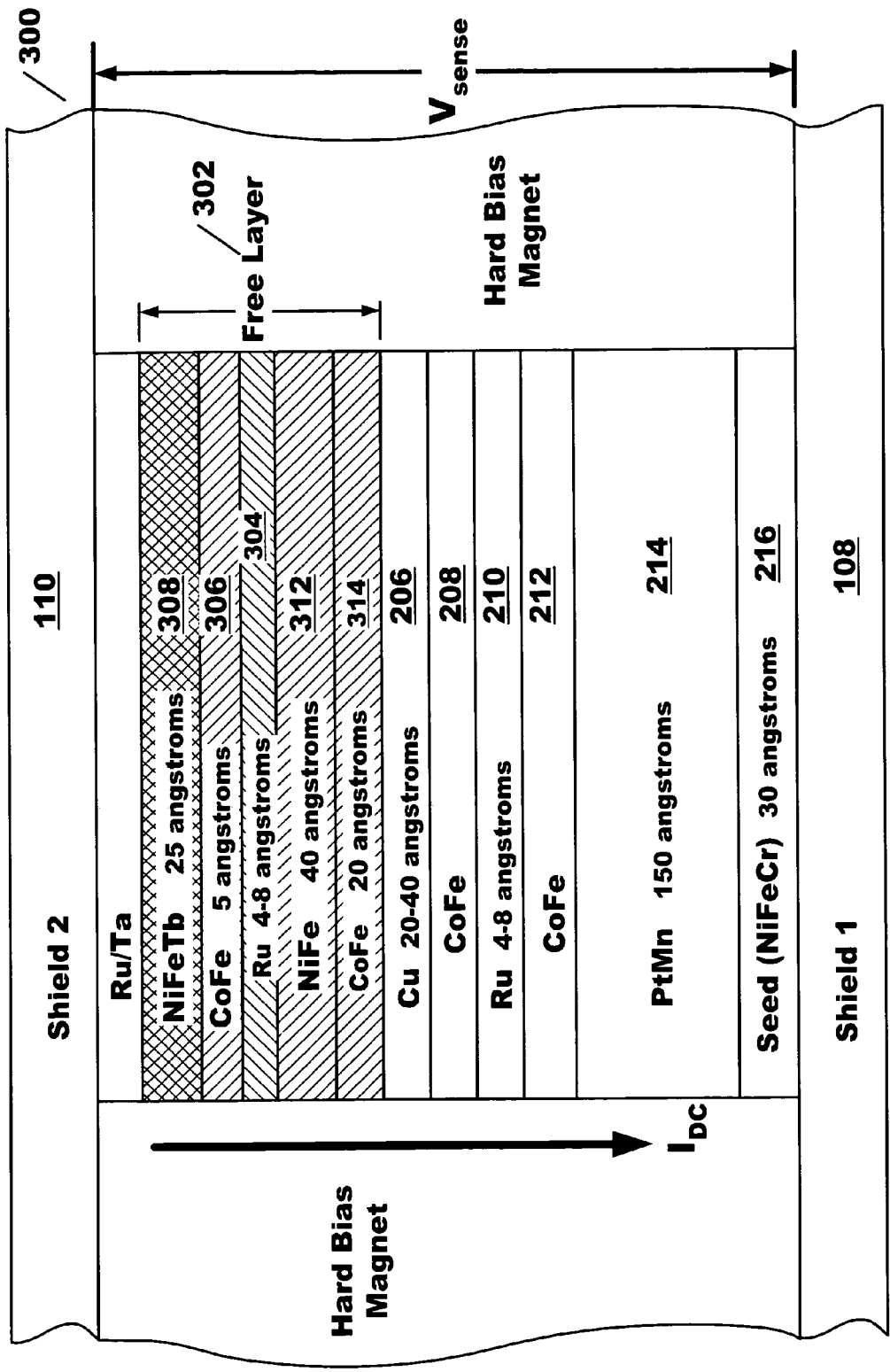
FIG. 3 is an air bearing surface view of a GMR sensor in accordance with an embodiment of the present invention.

FIG. 3 is an air bearing surface view of a GMR sensor 300 in accordance with an embodiment of the present invention. Seed layer 216, anti-ferromagnetic layer 214, pinned layer 212, referenced pinned layer 208, and spacer layer 206 are constructed as previously described in FIG. 2, as is well known to those skilled in the art. However, free layer 204 of the prior art is replaced with layers 308-314 of the present invention, which may be described as a synthetic free layer 302. The synthetic free layer comprises a CoFe layer 314, a NiFe layer 312, a Ru layer 304, a CoFe layer 306, and NiFeTb layer 308. The atomic components of each layer 308-314, as designated in FIG. 3, are for identification only. The specific stoichiometry is specified below. For example, CoFe layer 314 actually comprises preferably about 10 atomic % Fe, 90 atomic % Co, but can vary from about 5 atomic % Fe, 95 atomic % Co to 15 atomic % Fe, 85 atomic % Co. Layer 314 may be between 10 and 30 angstroms thick, preferably about 20 angstroms thick. NiFe layer 312 comprises about 20 atomic % Fe and 80 atomic % Ni. Layer 312 may be between 20 and 60 angstroms thick, preferably about 40 angstroms thick. Ru layer 304 may be between 4 and 8 angstroms in thickness. CoFe layer 306 is between 2 to 10 angstroms in thickness, preferably about 5 angstroms in thickness. The specific composition is the same as layer 314. Layer 308 contains Ni, Fe, and Tb. The Tb in layer 308 is present in concentrations from about 2 to 10 atomic %, preferably between 2 and 5 atomic %. The remainder is Fe and Ni, in a atomic ratio of about 4:1 (Ni:Fe). For example, for a Tb concentration of 10 atomic %, Fe would be about 18%, and Ni about 72 atomic %. For 2% Tb, Fe would be about 19.6%, and Ni 78.4%. Layer 308 is between 10 and 40 angstroms thick, preferably between 20 and 30 angstroms thick.

As disclosed in the related art by Bailey et al. cited above, small additions of Tb to NiFe can substantially increase the effective magnetic damping of the NiFeTb alloy film without otherwise significantly changing the primary magnetic properties relative to NiFe. This increased damping (by enhanced spin-orbit coupling) acts like a "magnetic-friction" which necessarily increases the rate at which energy in the dynamical magnetization of the NiFeTb can be dissipated into the lattice. Because the composite CoFe/NiFeTb layers (306, 308) are antiferromagnetically coupled strongly to the functional composite NiFe/CoFe free layer (314,312) through the Ru layer 304, the addition of Tb in layer 308 will also effectively increase the frictional damping of the magnetization motion of the aforementioned functional free layer. This enhanced damping/friction will allow for an increase in IDC prior to where the energy absorbed by the free layer from the spin-polarized dc current IDC exceeds the rate of damping to the lattice and the concomitant onset of spin-torque instability. This increase in IDC under stable operating conditions translates directly into an increase in signal or sensitivity of the GMR sensor 300.

Figure 4:
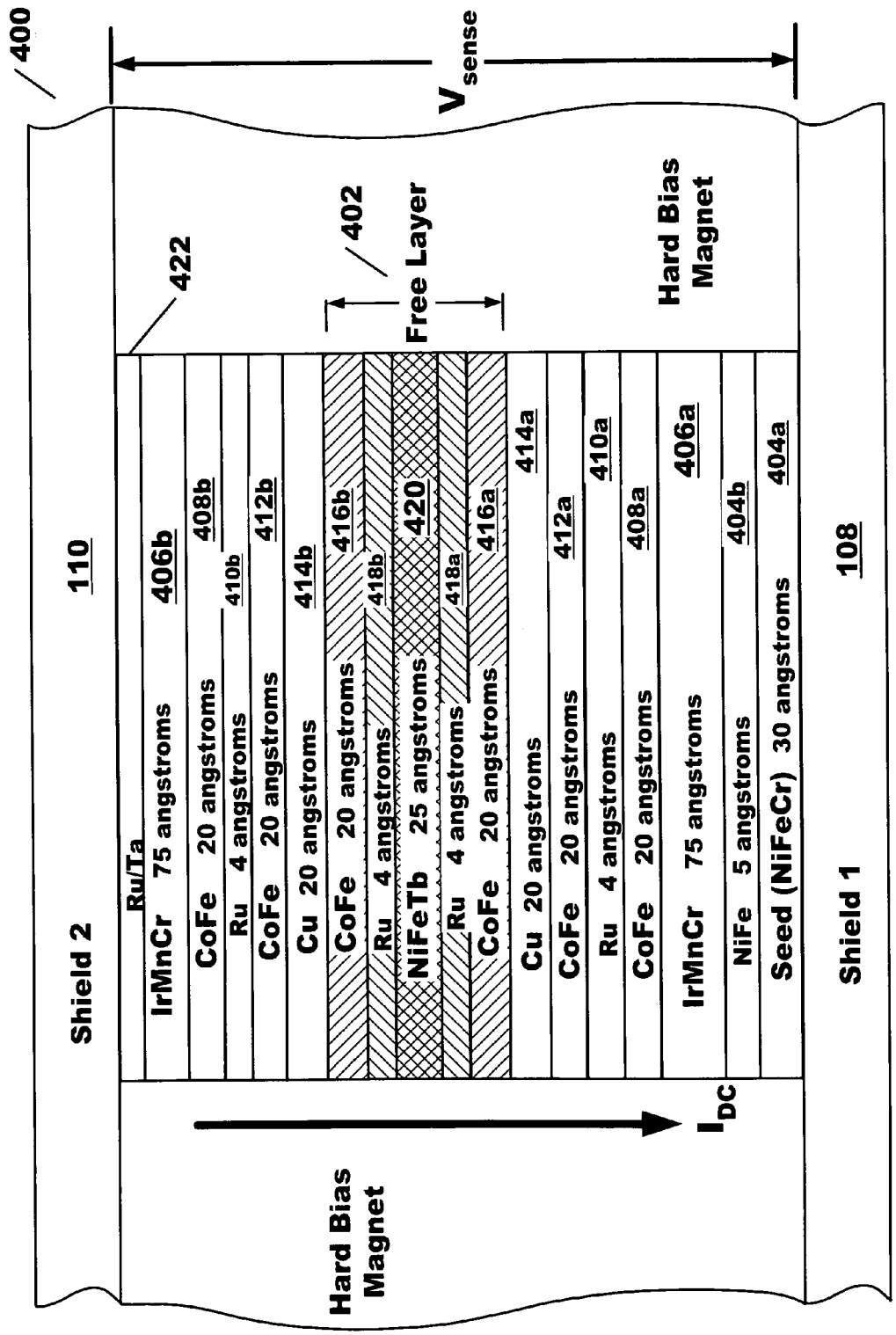
FIG. 4 is an air bearing surface view of a dual GMR sensor in accordance with an embodiment of the present invention; and, FIG. 5 is an air bearing surface view of a compact dual GMR sensor in accordance with an embodiment of the present invention.

FIG. 4 is an air bearing surface view of a dual GMR sensor 400 in accordance with an embodiment of the present invention. This configuration further increases measurement gain by incorporating two sets of anti-ferromagnetic pinning layers 406a,b; two sets of pinned and pinned reference layers (408a,b and 412a,b); two spacer layers 414a,b; and free layer 402. Within free layer 402 are a centrally located NiFeTb containing layer 420, sandwiched between Ru interface layers 418a,b and CoFe layers 416a,b. Layer 420 is between 10 and 40 angstroms thick, preferably between 20 and 30 angstroms thick. The Tb in layer 420 is present in concentrations from about 2 to 10 atomic %, preferably between 2 and 5 atomic %. The remainder is Fe and Ni, in a atomic ratio of about 4:1 (Ni:Fe). Ru interface layers 418a,b are about 4-8 angstroms thick. CoFe layers 416a,b are between 10 and 50 angstroms thick, preferably about 20 angstroms thick. They have the same composition as previously described in layers 314 and 306 above.

Seed layers 404a,b comprise a first NiFeCr containing layer, nominally 30 angstroms in thickness, covered by a 5-angstrom layer of NiFe. The composition of layers 404a,b are well known to those skilled in the art. Anti-ferromagnetic pinning layers 406a,b comprise Ir, Mn, and Cr. Layers 406a,b are nominally 75 angstroms thick, but may be between 40 and 100 angstroms thick. CoFe layers 408a,b and 412a,b are nominally 20 angstroms thick, but may be between 10 and 30 angstroms thick. They have the same composition as previously described in layers 314 and 306 above. Copper spacer layers 414a,b are nominally about 20 angstroms thick, but may be between 10 and 40 angstroms thick. Ru interface layers 410a,b are about 4-8 angstroms thick. Ru/Ta interface layer 422 is placed between anti-ferromagnetic layer 406b and shield 2.

One disadvantage of the dual sensor of FIG. 4 is that the additional layers required for the dual sets of pinning and pinned layers can produce a total film stack thicker than that of FIG. 3. This may reduce the resolution of the GMR sensor, since the distance between shield 1 and shield 2 is a factor in determining the smallest size magnetic element that can be detected on the media. In order to overcome this potential shortcoming, a preferred embodiment of the low noise dual GMR is provided in FIG. 5.

Figure 5:
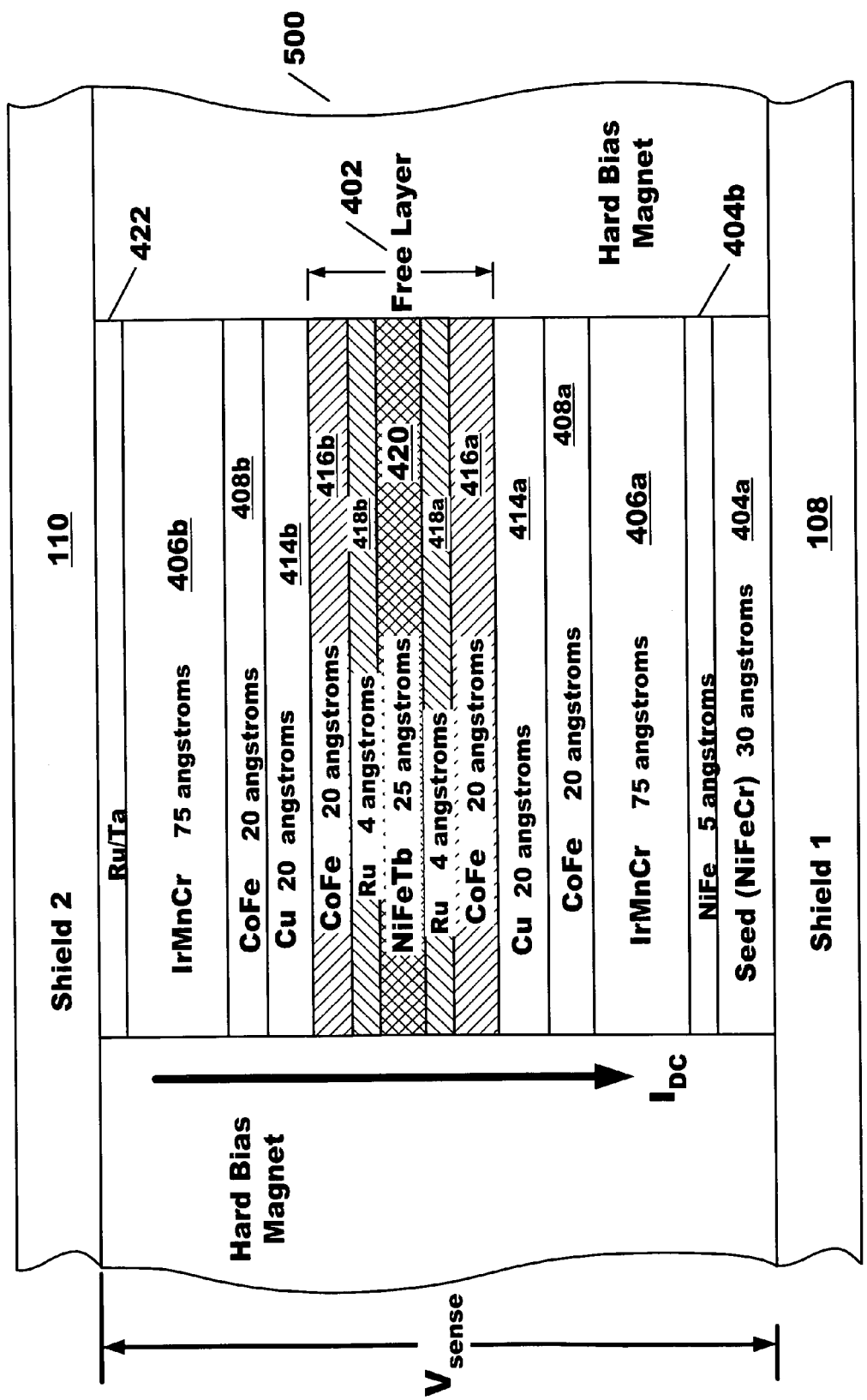

FIG. 5 is an air bearing surface view of a compact dual GMR sensor 500 in accordance with an embodiment of the present invention. In this embodiment, pinned reference layers 412a,b have been removed, along with corresponding Ru interface layers 410a,b. This alteration provides a shorter film stack and therefore a higher resolution sensor than that of FIG. 4. All other layers remain as described previously. A high sensitivity is provided by the noise reduction of the Tb containing layer 420, coupled with the amplification of the dual sensor structure.

The present invention is not limited by the previous embodiments heretofore described. Rather, the scope of the present invention is to be defined by these descriptions taken together with the attached claims and their equivalents.

What is claimed is:

1. A GMR sensor comprising:
   an anti-ferromagnetic layer;
   a first pinned layer coupled to said anti-ferromagnetic layer;
   an interface layer formed over said first pinned layer;
   a second pinned layer formed over said interface layer;
   a spacer layer formed over said second pinned layer; and,
   a free layer further comprising
      a first CoFe containing layer formed over said spacer layer,
      a first NiFe containing layer formed over said first CoFe containing layer,
      a Ru containing layer formed over said first NiFe containing layer,
      a second CoFe containing layer formed over said Ru containing layer, and
      a second NiFe containing layer formed over said second CoFe containing layer, wherein said second NiFe containing layer comprises a NiFeTb alloy.

2. The sensor as recited in claim 1, wherein said second NiFe containing layer comprises Tb between 2 and 10 atomic percent.

3. The sensor as recited in claim 1, wherein said second NiFe containing layer comprises Tb between 2 and 5 atomic percent.

4. The sensor as recited in claim 1, wherein said second NiFe containing layer is between 10 and 30 angstroms in thickness.

5. The sensor as recited in claim 1, wherein said first and second NiFe containing layers comprises a Ni to Fe atomic ratio of approximately 4 to 1.

6. The sensor as recited in claim 1, wherein said first CoFe containing layer is between 10 and 30 angstroms thick.

7. The sensor as recited in claim 1, wherein said second CoFe containing layer is between 2 and 10 angstroms thick.

8. The sensor as recited in claim 1, wherein said first and second CoFe containing layers comprise an Fe concentration between 5 and 15 atomic percent, and a Co concentration between 85 and 95 atomic percent.

9. The sensor as recited in claim 1, wherein said first NiFe containing layer is between 20 and 60 angstroms thick.

* * * * *